(12) United States Patent
Huang

(10) Patent No.: US 6,186,154 B1
(45) Date of Patent: *Feb. 13, 2001

(54) FIND END POINT OF CLF3 CLEAN BY PRESSURE CHANGE

(75) Inventor: Wen-Liang Huang, Hsinchu (TW)

(73) Assignee: Taiwan Semiconductor Manufacturing Company, Hsin-Chu (TW)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/206,742

(22) Filed: Dec. 7, 1998

(51) Int. Cl.$^7$ .............................. B08B 6/00; H01L 21/302
(52) U.S. Cl. .......................... 134/1.1; 134/21; 134/22.1; 438/5; 216/59; 216/79
(58) Field of Search .......................... 134/1.1, 21, 22.1; 216/59, 61, 79; 156/345; 438/5

(56) References Cited

U.S. PATENT DOCUMENTS

| | | | |
|---|---|---|---|
| 4,498,953 | * 2/1985 | Cook et al. | 156/646 |
| 5,252,178 | * 10/1993 | Moslehi | 156/643 |
| 5,387,777 | 2/1995 | Bennett et al. | 219/121.43 |
| 5,458,732 | * 10/1995 | Butler et al. | 216/61 |
| 5,482,749 | * 1/1996 | Telford et al. | 427/578 |
| 5,584,963 | 12/1996 | Takahashi | 156/646.1 |
| 5,604,134 | 2/1997 | Chang et al. | 437/8 |
| 5,643,364 | 7/1997 | Zhao et al. | 118/723 |
| 5,679,214 | 10/1997 | Kuo | 156/643.1 |
| 5,753,137 | 5/1998 | Ye et al. | 252/79.1 |
| 5,844,195 | * 12/1998 | Fairbairn et al. | 219/121.43 |
| 5,902,403 | * 5/1999 | Aitani et al. | 118/723 |

FOREIGN PATENT DOCUMENTS

| | | |
|---|---|---|
| 863536 | * 9/1998 | (EP) . |
| 63-129629 | * 6/1988 | (JP) . |
| 2-190472 | * 7/1990 | (JP) . |
| 6-224163 | * 8/1994 | (JP) . |
| 9-082645 | * 3/1997 | (JP) . |
| 9-293710 | * 11/1997 | (JP) . |

* cited by examiner

Primary Examiner—Gregory Mills
Assistant Examiner—George Goudreau
(74) Attorney, Agent, or Firm—George O. Saile; Stephen B. Ackerman

(57) ABSTRACT

A method for detecting completion of reaction chamber cleaning, comprising monitoring the pressure within the reaction chamber, calculating and tracking voltage versus time gradient of the pressure within the reaction chamber, recognizing when positive and negative gradients of pressure change have occurred and, based on this recognition, terminating the cleaning process of the reaction chamber.

31 Claims, 2 Drawing Sheets

FIND END POINT OF CLF3 CLEAN BY PRESSURE CHANGE

FIELD OF THE INVENTION

The present invention relates to semiconductor manufacturing, and more specifically to end-point detection for the cleaning process of cleaning Chemical Vapor Deposition chambers.

DESCRIPTION OF THE PRIOR ART

The semiconductor industry is continually striving to increase the performance of semiconductor chips while maintaining or striving to decrease the cost of semiconductor chips. These objectives have been successfully addressed by the trend to micro-miniaturization and of the ability to produce chips with sub-micron features.

The attainment of micro-miniaturization has been aided by the advances in specific semiconductor fabrication disciplines, basically photolithography and dry etching. The use of more sophisticated exposure cameras, as well as the use of more sensitive photo-resist materials, have allowed sub-micron features to be routinely achieved in photo-resist layers. In addition, the development of dry etching tools and procedures have allowed the successful transfer of the sub-micron images, in an overlying photo-resist layer, to an underlying material that is used in the fabrication of semiconductors. The tools and procedures used during Reactive Ion Etching (RIE) now allow single wafer etching to be performed. This allows each single wafer to be etched individually, with end point detection used for only this single wafer. Thus wafer to wafer uniformity variations, of the layer being patterned using single layer RIE etching, is not as great a problem as encountered with batch RIE etching. Thus large volumes of wafers can be confidently processed using single wafer RIE procedures, with a decreased risk of under or over-etching due to thickness variations of the material being etched.

A major limitation of dry etching procedures is the ability to maintain a strong end point detection signal from wafer to wafer. With the use of single wafer RIE tools, the wafer being etched is moved to the etch chamber of the single wafer RIE tool, which also contains a window, which allows the monitoring of the etching sequence. Laser endpoint detection apparatus monitors the chemistry of the reactants and by-products, through this window. At the conclusion of the etching cycle the chemistry of the by-products will change, and the end-point detection process will monitor this change. If however the window through which the endpoint monitoring takes place becomes layered with adhering RIE products, the endpoint detection signal will decrease in intensity which can at times result in erroneous end-point signals.

The present invention will describe a process for finding the endpoint for a Chemical Vapor Deposition tool cleaning procedure by monitoring the change in the pressure within the cleaning chamber. The present invention is therefore directed towards the cleaning of sensors or endpoint detection windows.

U.S. Pat. No. 5,584,963 (Takahashi) shows a method to clean a CVD reactor.

U.S. Pat. No. 5,604,134 (Chang et al.) teaches a particle monitor method for reactors.

U.S. Pat. No. 5,753,137 (Ye et al.) shows a CVD chamber cleaning process.

U.S. Pat. No. 5,679,214 (Kuo) discloses an endpoint detection for a dry clean process for a RIE tool.

U.S. Pat. No. 5,387,777 (Bennett et al.) teaches a process for cleaning plasma tools.

U.S. Pat. No. 5,643,364 (Zhao et al.) shows a plasma chamber with a endpoint etch detector.

SUMMARY OF THE INVENTION

In accordance with the present invention, it is an objective of the present invention to provide a method for end-point detection for cleaning CVD chambers.

Another objective of the present invention is to reduce the usage of cleaning gas during the cleaning of CVD chambers.

Yet another objective of the present invention is to prolong the lifetime of CVD processing kits.

In accordance with the objective of the present invention, the invention teaches a method to identify the end-point for the CVD cleaning operation by monitoring the pressure within the cleaning chamber. Experiments have shown that the degree of cleaning of a CVD chamber can be predicted by monitoring the pressure within the chamber.

If the cleaning cycle is started with a clean CVD chamber, the pressure within the chamber remains constant during a repeat cleaning cycle. If the cleaning cycle is started with a CVD chamber into which first a light coating of the cleaning gas has been deposited, the pressure increases during the cleaning cycle. If the cleaning cycle is started with a CVD chamber into which first a heavier coating of the cleaning gas has been deposited, the pressure again increases during the cleaning cycle but this time at a slower rate than in conditions of a light initial coating. The conclusion from these experiments is that as soon as there are no more impurities within the CVD chamber, the pressure within the chamber takes on a constant value. Inversely than, by monitoring the pressure within the chamber and by detecting the point in time where the pressure is stable, it can be concluded that the chamber cleaning process has been completed.

BRIEF DESCRIPTION OF THE DRAWINGS

The drawings presented which form an integral part of the present invention show the results obtained during a set of experiments, as follows.

DETAILED DESCRIPTION OF THE PREFERRED EMBODIMENT

The present invention relates to the process of cleaning a Chemical Vapor Deposition chamber that has been used for the depositions of $WS_{ix}$ gases. The deposition sequence for such a chamber is as follows:

1) deposit $WF_6$ or $WS_{ix}$
2) deposit $S_xClH_2$
3) deposit $S_xH_4$.

These gasses are distributed within the CVD chamber using the conventional 'shower head' distribution approach.

After a sequence of 25 wafer depositions as indicated above, the CVD chamber needs to be cleaned. The cleaning gas uses for this cleaning process is $ClF_3$, the typically recommended parameters for this cleaning process are as follows: time of cleaning 200 seconds, 100 SCCM (Standard Cubic Centimeter per Second), temperature 475 degrees C., pressure 3 Torr. Since this cleaning process does not involve a plasma clean, there is no DC bias voltage applied between the plates.

Figure 1:
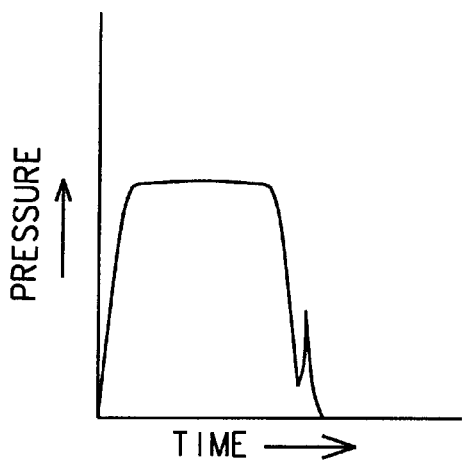
FIG. 1 shows the variation in pressure with time for a CVD chamber cleaning process where the cleaning process was started with a previously cleaned CVD chamber.

Referring now more specifically to FIG. 1, there is shown the variation of pressure within the CVD chamber for the case where the CVD chamber has previously been cleaned. The graph indicates that the pressure within the CVD chamber remains constant during the cleaning process at 2.92 Torr.

Figure 2:
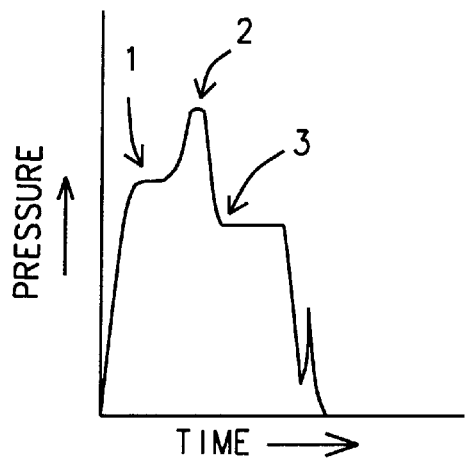
FIG. 2 shows the variation in pressure with time for a CVD chamber cleaning process where the cleaning process was started with a CVD chamber into which a small amount of dopant or impurity gas had been released into the CVD chamber.

Referring now to FIG. 2, there is show the variation of pressure within the CVD chamber for the case where the CVD chamber has previously been thin coated, that is a one time deposition had been applied, with $ClF_3$. The figure indicates that the pressure within the CVD chamber increases during the cleaning process. The pressure within the CVD chamber increases to 3.16 Torr, point 2, after which the pressure decreases to 2.92 Torr, point 3, and remains stable after that. At the point where the pressure within the CVD chamber has decreased to 2.92 Torr and where it remains stable after that, the cleaning process of the CVD chamber is complete.

Figure 3:
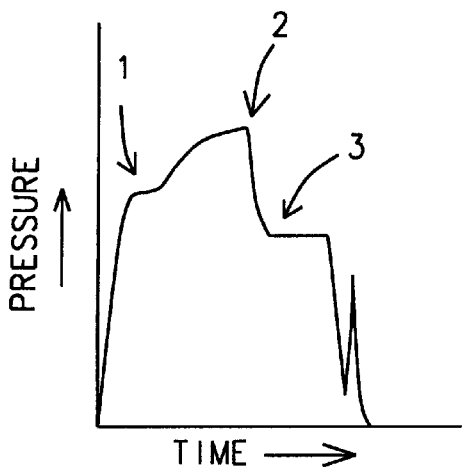
FIG. 3 shows the variation in pressure with time for a CVD chamber cleaning process where the cleaning process was started with a CVD chamber into which a larger amount of dopant or impurity gas had been released into the CVD chamber.

Referring now to FIG. 3, there is show the variation of pressure within the CVD chamber for the case where the CVD chamber has previously been thick-coated, that is three depositions of $ClF_3$ have been applied. The figure indicates that, similar to the phenomenon that was observed under FIG. 2, the pressure within the CVD chamber increases during the cleaning process. The pressure within the CVD chamber again starts, point 1, a rapid increase to 3.16 Torr, point 2, after which the pressure decreases to 2.92 Torr, point 3, and remains constant after that. The only difference between the phenomena of FIGS. 2 and 3 is that the variation in pressure occurs at longer at a slower rate for the case where the cleaning process was started with a heavier coated CVD chamber. At the point where the pressure within the CVD chamber has decreased to 2.92 Torr and where it remains stable after that, the cleaning process of the CVD chamber is complete.

It is to be noted that, where the CVD chamber has not yet reached the state of being clean, the pressure versus time curve exhibits three points of interest. These three points are where there is a sharp change in the pressure versus time curve. The first point, see 1, FIG. 3, is where the pressure stops increasing and, for a short period of time, levels of to being constant. This point has a negative coefficient of pressure variation. The second point, see 2, FIG. 3, is where the pressure has reached its highest value and starts to decrease. This point also has a negative coefficient of pressure variation. The third point, see 3, FIG. 3, is where the pressure changes from decreasing to a constant value. This point has a positive coefficient of pressure variation. It is clear that, between points 1 and 2, FIG. 3, the pressure increases with time. Initially this pressure increase is very gradual, it reaches the point where the pressure increases at a rapid rate which is the point where the reaction for $Cl_3F_3$ and WSix is starting to take place.

From the above it is clear that by monitoring the pressure within the CVD chamber it can be determined when the cleaning process of the CVD chamber is complete. The following flowchart shows this procedure.

Figure 4:
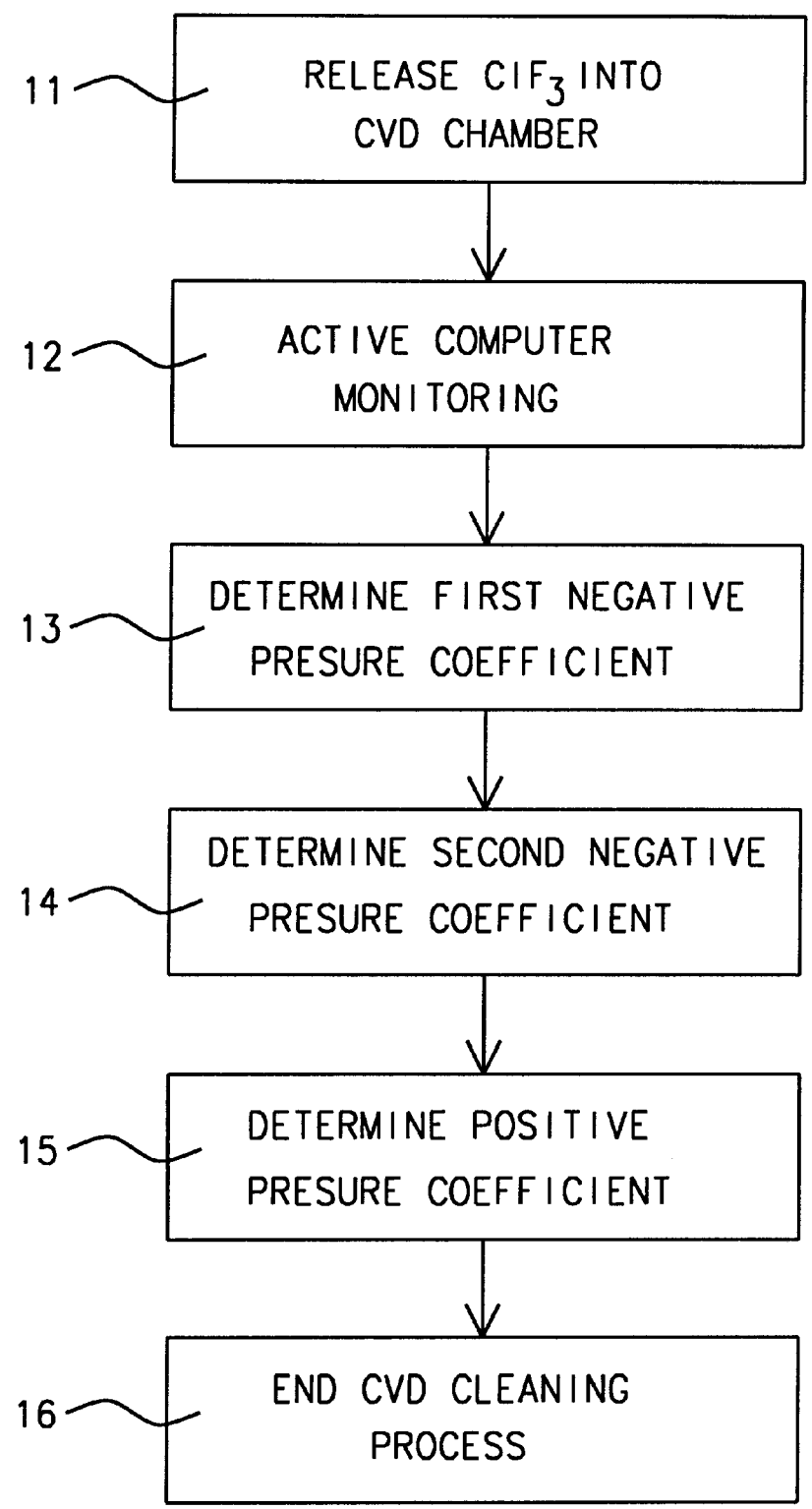
FIG. 4 shows a flow-chart of the processing steps that are required to determine the end point of the CVD chamber cleaning cycle within the scope of the present invention.

FIG. 4 shows the sequence of events that occur and which enable detection of completion of the CVD chamber cleaning process. It is to be noted that these events can be traced real-time by computer monitoring and analysis. Time-delay in measuring the various parameters or in implementing the conclusions derived from the measured parameters can therefore be considered to be non-existent.

FIG. 4, step 1, shows the start of the cleaning process by the release of the $ClF_3$ cleaning gas into the CVD chamber.

FIG. 4, step 2, initiates the monitoring pressure within the CVD chamber.

FIG. 4, step 3, is the first point where the curve of pressure versus time undergoes a rapid change, that is where the pressure stops increasing and levels of to being constant. Refer to point 1, FIG. 3. This point has a negative coefficient of pressure variation. Computer monitoring can detect this point.

FIG. 4, step 4 is the second point where the curve of pressure versus time undergoes a rapid change, that is where the pressure has reached its highest value and start decreasing. Refer to point 2, FIG. 3. This point has a negative coefficient of pressure variation. Computer monitoring can detect this point.

FIG. 4, step 5 is the third point where the curve of pressure versus time undergoes a rapid change, that is where the pressure changes from decreasing to a constant value. Refer to point 3, FIG. 3. This point has a positive coefficient of pressure variation. Computer monitoring can detect this point.

FIG. 4, step 6 indicates that the CVD chamber monitoring apparatus has detected and identified the conditions where the cleaning of the CVD has been completed. The monitoring apparatus therefore terminates the cleaning process.

Although the preferred embodiment of the present invention has been disclosed for illustrative purposes, those skilled in the art will appreciate that various modifications, additions and substitutions are possible without departing from the scope and spirit of the invention as disclosed in the accompanying claims.

What is claimed is:

1. A method for detecting completion of reaction chamber cleaning whereby the processing steps that are performed by said reaction chamber comprise successive deposition of reactant gasses that are deposited for formation of semiconductor devices, said reactant gasses being sequentially deposited in an uninterrupted processing sequence over a surface of at least one semiconductor substrate that is positioned inside said reaction chamber, said sequential deposition comprising a deposition of $WF_6$ or $WSi_x$ followed by a deposition of $SiClH_2$ followed by a deposition of $SiH_4$, said method comprising:

provinding a reaction chamber adapted to receive a semiconductor substrate and reactant gasses therein;

performing one or more sequences of said processing sequences that are performed inside said reaction chamber;

introducing a cleaning agent comprising $ClF_3$ into said reaction chamber, starting a process of cleaning said reaction chamber, said introducing a cleaning agent containing $ClF_3$ into said reaction chamber to be initiated after said at least one semiconductor substrate has been removed from said CVD reaction chamber, said removal to be performed after at least one of said sequential depositions comprising a deposition of $WF_6$ or $WSi_x$ followed by a deposition of $SiClH_2$ followed by a deposition of $SiH_4$ has been completed;

monitoring pressure within said reaction chamber;

calculating and tracking pressure versus time gradient of change for said pressure within said reaction chamber; and terminating the cleaning process of said reaction chamber.

2. The method of claim 1 wherein said reaction chamber is a $WS_{ix}$ CVD chamber.

3. The method of claim 1 wherein said introducing a cleaning agent containing $ClF_3$ into said reaction chamber is introducing $ClF_3$ into said reaction chamber for a time between about 150 and 250 seconds, at a flow rate of between 75 and 125 SCCM, at a temperature between about 400 and 550 degrees C. and a pressure between about 2 and 4 Torr.

4. The method of claim 1 wherein said monitoring said pressure within said reaction chamber is a computer based monitoring system.

5. The method of claim 1 wherein said calculating said pressure within said reaction chamber is measuring said pressure at intervals in time wherein said intervals are of short duration relative to the time duration of said cleaning process and wherein a positive or negative gradient of pressure over time can be identified and wherein said gradient can be compared with pre-set values for said gradient.

6. The method of claim 1 wherein said tracking of said pressure is comparing said calculated gradient of pressure over time with pre-set values for said gradient and wherein an internal to the tracking mechanism marker is set that identifies said gradient as positive or negative and that identifies the sequence or frequency of occurrence of said positive or negative gradient within a given tracking sequence and wherein a concluding indicator is activated whenever said positive or negative gradients exceed a limit.

7. The method of claim 1 wherein said terminating said cleaning process is recognizing said concluding indicator whereupon signaling and activating the termination of said cleaning process.

8. The method of claim 1 wherein said reaction chamber is a single wafer chamber.

9. The method of claim 1 wherein said reaction chamber is a batch type chamber.

10. A method for end-point detection of a CVD reaction chamber cleaning process, said CVD reaction chamber being used for successive deposition of reactant gasses that are deposited for formation of semiconductor devices, said reactant gasses being sequentially deposited in an uninterrupted processing sequence over a surface of at least one semiconductor substrate that is positioned inside said CVD reaction chamber, said sequential deposition comprising a deposition of $WF_6$ or $WSi_x$ followed by a deposition of $SiClH_2$ followed by a deposition of $SiH_4$, said method comprising:

providing a reaction chamber adapted to receive a semiconductor substrate and to perform deposition of reactant gas therein;

providing a least one semiconductor substrate, positioning said at least one semiconductor substrate in said CVD reaction chamber, said positioning to be such that reactant gasses can be deposited on a surface of said at least one semiconductor substrate;

initiating said deposition processes within said CVD reaction chamber, whereby each deposition process is performed to completion of said deposition process, whereby said deposition process is completed after a deposition of $WF_6$ or $WSi_x$ followed by a deposition of $SiClH_2$ followed by a deposition of $SiH_4$ over a surface of said at least one semiconductor substrate;

tracking frequency of completion of said CVD reaction chamber deposition processes since a preceding reaction cleaning process has been completed;

initiating said CVD reaction chamber cleaning process, said CVD reaction chamber cleaning process being initiated after said frequency of completion has reached a limit, said initiating of said CVD reaction chamber cleaning process to be performed after removing said at least one semiconductor substrate from said CVD chamber;

tracking pressure within said reaction chamber during said CVD reaction chamber cleaning process;

determining positive and negative gradient of change of said pressure as a function of time;

tracking positive and negative gradient of pressure change as a function of time;

determining that said CVD reaction chamber cleaning process is completed; and terminating said reaction chamber cleaning process.

11. The method of claim 10 wherein said reaction chamber is a $WS_{ix}$ CVD chamber.

12. The method of claim 10 wherein said in troducing a cleaning agent containing $ClF_3$ into said reaction chamber is introducing $ClF_3$ into said reaction chamber for a time between about 150 and 250 seconds, at a flow rate of between 75 and 125 SCCM, at a temperature between about 400 and 550 degrees C. and a pressure between about 2 and 4 Torr.

13. The method of claim 10 wherein said reaction chamber is a single wafer chamber.

14. The method of claim 10 wherein said reaction chamber is a batch type chamber.

15. The method of claim 10 wherein said tracking pressure within said reaction chamber is providing instrument readings that reflect said reaction chamber pressure as a function of time to a computer controlled monitoring system where said readings are recorded for and are uniquely related to each said CVD reaction chamber cleaning process.

16. The method of claim 10 wherein said determining positive and negative gradient of pressure change as a function of time is a computer software routine that calculates said rate of change of said reaction chamber pressure as a function of time wherein the time interval used for said calculation is short with relation to the overall time required to complete said CVD reaction chamber cleaning process.

17. The method of claim 16 wherein said time interval used for said calculation is 1% of said overall time required to complete said CVD reaction chamber cleaning process.

18. The method of claim 16 wherein said time interval used for said calculation is a fraction or percentage of said overall time required to complete said CVD reaction chamber cleaning process said fraction to be a manually entered parameter.

19. The method of claim 16 wherein said overall time required to complete said CVD reaction chamber cleaning process is a manually entered parameter.

20. The method of claim 16 wherein said overall time required to complete said CVD reaction chamber cleaning process is a parameter determined by said pressure tracking mechanism.

21. The method of claim 17 wherein said overall time required to complete said CVD reaction chamber cleaning process is a manually entered parameter.

22. The method of claim 17 wherein said overall time required to complete said CVD reaction chamber cleaning process is a parameter determined by the pressure tracking mechanism.

23. The method of claim 10 wherein said tracking positive and negative gradient of pressure change as a function of time is identifying each occurrence of positive and negative gradient of pressure change as a function of time and accumulating the total number of said occurrences of positive and negative gradient of pressure change as a function of time.

24. The method of claim 10 wherein said tracking said frequency of said CVD reaction chamber deposition processes completed is identifying each occurrence of said CVD reaction chamber deposition processing that occurred since the completion of the preceding CVD reaction chamber cleaning process and accumulating the total number of said occurrences of said CVD reaction chamber deposition processing.

25. The method of claim 10 wherein initiating said CVD reaction chamber cleaning process is identifying when said accumulated total number of said occurrences of said CVD reaction chamber deposition processing has reached a set limit.

26. The method of claim 25 wherein said limit is manually adjusted whereupon said CVD reaction chamber cleaning process is initiated.

27. A method for end-point detection of a CVD reaction chamber cleaning process whereby said CVD reaction chamber is used for successive deposition of reactant gasses that are deposited for formation of semiconductor devices, said reactant gasses being sequentially deposited in an uninterrupted processing sequence over a surface of at least one semiconductor substrate that is positioned inside said CVD reaction chamber, said sequential deposition comprising a deposition of $WF_6$ or $WSi_x$ followed by a deposition of $SiClH_2$ followed by a deposition of $SiH_4$, said method comprising:

provided a reaction chamber adapted to receive a semiconductor substrate and to perform deposition of reactant gas therein;

providing a least one semiconductor substrate, positioning said at least one semiconductor substrate in said CVD reaction chamber, said positioning to be such that reactant gasses can be deposited on a surface of said at least one semiconductor substrate;

initiating said deposition processes within said CVD reaction chamber, whereby each deposition process is performed to completion of said deposition process, whereby said deposition process is completed after a deposition of $WF_6$ or $WSi_x$ followed by a deposition of $SiClH_2$ followed by a deposition of $SiH_4$ over a surface of said at least one semiconductor substrate;

tracking frequency of said CVD reaction chamber deposition processes completed since a preceding reaction cleaning process has been completed, identifying each occurrence of said CVD reaction chamber deposition processing that occurred since completion of a preceding CVD reaction chamber cleaning process, accumulating a total number of said occurrences of said CVD reaction chamber deposition processing;

initiating said CVD reaction chamber cleaning process by introducing $ClF_3$ as a cleaning agent into said CVD reaction chamber, said initiation to occur when said accumulated total number of said occurrences of said CVD reaction chamber deposition processing has reached a limit, said cleaning process to be performed after removing of said at least one semiconductor substrate from said CVD chamber after said frequency of completion of said CVD reaction chamber deposition processes since a preceding reaction cleaning process has been completed has been reached;

tracking pressure within said reaction chamber during said CVD reaction chamber cleaning process;

determining positive and negative gradient of the change of said pressure as a function of time;

tracking positive and negative gradient of pressure change as a function of time;

determining that said CVD reaction chamber cleaning process is completed, wherein determining that said CVD reaction chamber cleaning process is completed is determining when a sequence of a first positive gradient of pressure change followed by a second positive gradient of pressure change followed by a first negative gradient of pressure change has been completed; and terminating said reaction chamber cleaning process.

28. The method of claim 10 wherein said terminating said reaction chamber cleaning process is sending a signal to the control equipment to terminate said CVD reaction chamber cleaning process.

29. The method of claim 10 wherein said initiating said CVD reaction chamber cleaning process is manual entry of a control command.

30. The method of claim 28 wherein said sending a signal to the control equipment to terminate said CVD reaction chamber cleaning process is generated by the control system.

31. The method of claim 28 wherein said sending a signal to the control equipment to terminate said CVD reaction chamber cleaning process is manually entered.

* * * * *